(12) United States Patent
Matsuzaki et al.

(10) Patent No.: US 10,779,450 B2
(45) Date of Patent: Sep. 15, 2020

(54) THERMALLY CONDUCTIVE COMPOSITION

(71) Applicants: Kitagawa Industries Co., Ltd., Inazawa-shi, Aichi (JP); Seiko Epson Corporation, Suwa-shi, Nagano (JP)

(72) Inventors: Toru Matsuzaki, Aichi (JP); Yasuhiro Kawaguchi, Aichi (JP); Masahiro Saito, Aichi (JP); Kensuke Mitsuya, Aichi (JP); Masaaki Ito, Nagano (JP); Toshiyuki Omori, Nagano (JP)

(73) Assignees: Kitagawa Industries Co., Ltd., Inazawa-shi (JP); Seiko Epson Corporation, Suwa-shi (JP)

( * ) Notice: Subject to any disclaimer, the term of this patent is extended or adjusted under 35 U.S.C. 154(b) by 0 days.

(21) Appl. No.: 16/508,617

(22) Filed: Jul. 11, 2019

(65) Prior Publication Data

US 2020/0022291 A1    Jan. 16, 2020

(30) Foreign Application Priority Data

Jul. 11, 2018  (JP) .................................. 2018-131901

(51) Int. Cl.
| | |
|---|---|
| *C08K 3/013* | (2018.01) |
| *H05K 9/00* | (2006.01) |
| *C08K 3/36* | (2006.01) |
| *C08K 3/38* | (2006.01) |
| *C08L 33/10* | (2006.01) |

(52) U.S. Cl.
CPC .......... *H05K 9/0088* (2013.01); *C08K 3/013* (2018.01); *C08K 3/36* (2013.01); *C08K 2003/385* (2013.01); *C08K 2201/001* (2013.01); *C08L 33/10* (2013.01)

(58) Field of Classification Search
CPC ......................... C08K 2201/001; C08K 3/013
See application file for complete search history.

(56) References Cited

U.S. PATENT DOCUMENTS

| | | | |
|---|---|---|---|
| 2006/0099403 A1 | 5/2006 | Johnson | |
| 2016/0122610 A1 | 5/2016 | Kawaguchi et al. | |
| 2016/0234981 A1* | 8/2016 | Do ........................... | C09K 5/14 |
| 2019/0075647 A1* | 3/2019 | Ito ........................ | H05K 1/0204 |

FOREIGN PATENT DOCUMENTS

| | | |
|---|---|---|
| JP | 2014-239236 A | 12/2014 |
| JP | 2016-92118 A | 5/2016 |

* cited by examiner

*Primary Examiner* — Hung V Ngo
(74) *Attorney, Agent, or Firm* — Crowell & Moring LLP

(57) ABSTRACT

A thermally conductive composition is provided, which has a base material; and at least one of a permittivity adjusting filler having a lower permittivity than the base material and a high permeability filler having a higher permeability than the base material. The entire thermally conductive composition has a relative permeability higher than 1 and a relative permittivity of 7 or lower.

9 Claims, 7 Drawing Sheets

FIG. 3

|  | RELATIVE PERMITTIVITY | RELATIVE PERMEABILITY |
|---|---|---|
| EXAMPLE 1 | 7.0 | 7 |
| EXAMPLE 2 | 7.0 | 7 |
| COMPARATIVE EXAMPLE 1 | 10.8 | 13 |
| COMPARATIVE EXAMPLE 2 | 34.0 | 1 |
| COMPARATIVE EXAMPLE 3 | 2.1 | 1 |

THERMALLY CONDUCTIVE COMPOSITION

CROSS-REFERENCE TO RELATED APPLICATION

This application is based on and claims the benefit of priority of the prior Japanese Patent Application No. 2018-131901, filed on Jul. 11, 2018, the entire contents of which are incorporated herein by reference.

BACKGROUND OF THE INVENTION

1. Field of the Invention

The present invention relates to a thermally conductive composition to promote heat dissipation from a heat source such as an electronic component.

2. Description of the Related Art

Conventionally, thermally conductive compositions such as thermally conductive sheets with superior thermal conductive properties have been manufactured. For example, a thermally conductive composition such as a thermally conductive sheet is sandwiched between a heat source such as an electronic component or the like and a heat dissipation device such as a heat sink or the like, and is used to efficiently transfer and release heat (dissipate heat) from the heat source to the heat dissipation device. Generally, in order to increase the thermal conductive properties (thermal conductivity) of the thermally conductive composition, it is composed to contain a large amount of highly thermally conductive micro-size or nano-size material (hereafter referred to as thermally conductive filler) such as insulating ceramics such as alumina or the like.

However, a conventional thermally conductive composition such as a thermally conductive sheet or the like containing a thermally conductive filler alone cannot reduce (absorb) an electromagnetic wave (noise) generated by an electronic component such as an IC (integrated circuit) or the like, although it can cope with heat generated by the electronic component or the like. This problem occurs due to the following phenomenon. When a metal body having electrically conductive properties is present in the vicinity of an electronic component such as an IC or the like, which generates an electromagnetic wave, the electromagnetic wave emitted from the IC or the like is transferred to the metal body. It is generally known that based on the size of the metal body and the frequency of the transferred electromagnetic wave, the metal body produces a resonance phenomenon and works as a kind of antenna, thereby emitting a stronger electromagnetic wave from the metal body.

Normally, a heat dissipation device is made of a metal body such as aluminum or the like and is placed in the vicinity of an IC or the like, thus causing the above problem of electromagnetic wave. It is also known that when a thermally conductive sheet with a higher permittivity (dielectric constant) than air is sandwiched between the IC or the like and the metal body, the resonant frequency of the metal body shifts to a lower frequency than in the case of air. In addition, a material with a higher permittivity, when present between the IC or the like and the heat dissipation device, increases the electrostatic capacitance to more efficiently transfer the electromagnetic wave emitted from the IC or the like to the heat dissipation device, thereby causing the electromagnetic wave emitted from the heat dissipation device to be even stronger. In recent years, a thermally conductive sheet is available, which uses a thermally conductive filler containing carbon and the like to increase the thermal conductivity. However, carbon has a very high permittivity to increase the electric field strength of the electromagnetic wave emitted from the heat dissipation device, which is a difficult problem to solve. Note that resonance is a phenomenon in which the impedance changes abruptly at a specific frequency, and causes the voltage or current to change as the impedance changes, making it more likely for electromagnetic wave interference to occur.

For this problem, it is known that a thermally conductive electromagnetic wave-absorbing sheet, which uses a thermally conductive sheet containing a magnetic filler (high permeability filler) such as ferrite or the like, is prepared, and this sheet is used to cover an electronic component so as to absorb an electromagnetic wave generated by the electronic component such as an IC or the like (for example, refer to Japanese Laid-open Patent Publication 2016-92118). This sheet containing the magnetic filler such as ferrite or the like makes it possible that in an electromagnetic wave generated by the resonance of the heat dissipation device with the electromagnetic wave generated by the electronic component described above, an electromagnetic wave in a high frequency range, in particular, is reduced.

However, the thermally conductive sheet containing the magnetic filler such as ferrite or the like described in Japanese Laid-open Patent Publication 2016-92118 makes it difficult to reduce an electromagnetic wave in a relatively low frequency range, for example, lower than 1 GHz, although it can reduce an electromagnetic wave in a relatively high frequency range, for example, 1 GHz or higher. The reason for this is as follows. The thermally conductive sheet containing a magnetic filler increases in permittivity only by the addition of the magnetic filler, and the resonant frequency of the metal body serving as a heat dissipation device shifts to a lower frequency. As the permittivity increases, the amount of shift of the resonant frequency to a lower frequency increases. Thus, the first (the lowest) resonant frequency significantly shifts to a lower frequency only by the addition of the magnetic filler, and the electric field strength of the electromagnetic wave in a frequency range below the post-shift resonant frequency increases. For example, when the length of one side of the heat dissipation device is about 100 mm, and the thermally conductive sheet is absent, then the first resonant frequency is around 1.2 GHz. In a frequency range below it, more specifically below about 1 GHz, the electric field strength of the electromagnetic wave from the heat dissipation device increases based on the above principle as the permittivity increases. In other words, the thermally conductive sheet containing the magnetic filler alone not only cannot reduce the electromagnetic wave in a relatively low frequency range (for example, below 1 GHz), but also significantly increases the electric field strength of the electromagnetic wave.

BRIEF SUMMARY OF THE INVENTION

An object of the present invention is to solve the problems described above, and to provide a thermally conductive composition which can reduce an electromagnetic wave regardless of the frequency range.

This object is achieved by a thermally conductive composition comprising: a base material; and at least one of a permittivity adjusting filler having a lower permittivity than the base material and a high permeability filler having a higher permeability than the base material, wherein the entire thermally conductive composition has a relative permeability higher than 1 and a relative permittivity of 7 or lower.

According to the structure, the relative permeability of the entire thermally conductive composition exceeds 1, and therefore, like the conventional thermally conductive composition such as the conventional thermally conductive sheet containing a magnetic filler such as ferrite, it is possible to reduce an electromagnetic wave in a high frequency range above about 1 GHz. Further, the reduction of the relative permittivity of the entire thermally conductive composition to a value as low as 7 or lower makes it possible that by sandwiching the thermally conductive composition between an electronic component such as IC or the like and a heat dissipation device such as heat sink or the like, the electrostatic capacitance between the electronic component such as IC or the like and the heat dissipation device is reduced, making it difficult to transfer the electromagnetic wave emitted from the electronic component such as IC or the like to the heat dissipation device. Therefore, it is possible to reduce the electromagnetic wave emitted from the heat dissipation device. Further, by reducing the relative permittivity of the entire thermally conductive composition to a value as low as 7 or lower as described above, it is possible to enhance the electromagnetic wave reduction effect, particularly in a relatively low frequency range (for example, a frequency range below 1 GHz).

The reason for this is as follows. Specifically, as the relative permittivity of the thermally conductive composition sandwiched between the electronic component such as IC or the like and the heat dissipation device increases, the resonant frequency of the heat dissipation device shifts to a lower frequency. Therefore, in a relatively low frequency range described above, the electric field strength of the electromagnetic wave from the heat dissipation device increases as the relative permittivity of the thermally conductive composition increases. In contrast, according to the thermally conductive composition of the present invention, the relative permittivity is designed to have a value as low as 7 or lower as described above, thereby making possible to shift the resonant frequency of the heat dissipation device to a higher frequency. This makes it possible to enhance the electromagnetic wave reduction effect in a relatively low frequency range (for example, a frequency range below 1 GHz). Thus, the thermally conductive composition according to the present invention can reduce an electromagnetic wave regardless of the frequency range (whether it is a low or high frequency range) of the electromagnetic wave.

Preferably, the thermally conductive composition comprises both the permittivity adjusting filler having a lower permittivity than the base material and the high permeability filler having a higher permeability than the base material.

Further preferably, the thermally conductive composition has a higher thermal conductivity than the base material.

Further preferably, at least one of the permittivity adjusting filler and the high permeability filler in the thermally conductive composition has an air region inside.

Further preferably, the permittivity adjusting filler in the thermally conductive composition is a material selected from the group consisting of boron nitride and silica.

Still further preferably, the relative permeability in the entire thermally conductive composition has an imaginary part.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that the drawings are shown for the purpose of illustrating the technical concepts of the present invention or embodiments thereof, wherein:

FIG. 3 is a table showing a relative permittivity and a relative permeability of each of thermally conductive sheets according to Examples 1 and 2 and Comparative Examples 1 to 3;

DETAILED DESCRIPTION OF THE INVENTION

Hereinafter, a thermally conductive composition according to an embodiment of the present invention will be described with reference to the drawings. The present embodiment illustrates an example where the thermally conductive composition is a thermally conductive sheet.

(Materials of Thermally Conductive Sheet)

Figure 1:
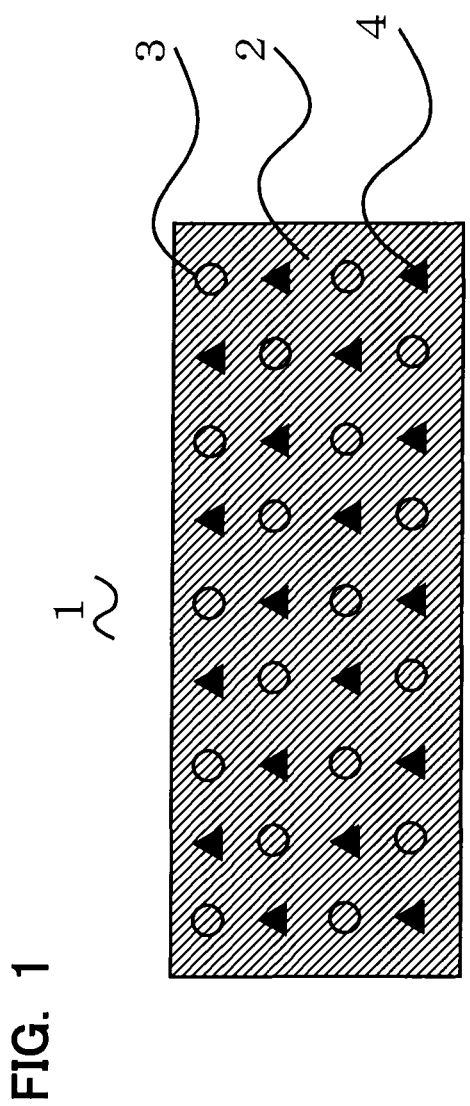
FIG. 1 is a schematic cross-sectional view of a thermally conductive sheet which is a thermally conductive composition according to an embodiment of the present invention.

FIG. 1 is a schematic cross-sectional view schematically showing the structure of a thermally conductive sheet according to the present embodiment. As shown in FIG. 1, the thermally conductive sheet 1 comprises: a base material 2; a permittivity adjusting filler 3 having a lower permittivity than the base material 2; and a high permeability filler 4 having a higher permeability than the base material 2. The thermally conductive sheet 1 uses the permittivity adjusting filler 3 to reduce the relative permittivity of the entire thermally conductive sheet 1 to 7 or lower. Further, the thermally conductive sheet 1 uses the high permeability filler 4 to increase the relative permeability of the entire thermally conductive sheet 1 to exceed 1. For example, an acrylic resin such as an acrylic polymer or the like, a silicone resin and other general resins can be used as appropriate for the base material 2. The acrylic polymer is a polymer or copolymer of an acrylic group resin containing a (meth)acrylic acid ester and a polymer made by polymerizing a monomer containing a (meth)acrylic acid ester.

The permittivity adjusting filler 3 can be a filler having an air region inside (hereafter referred to as "hollow filler"), or a material selected from the group consisting of boron nitride and silica (a generic term for silicon dioxide, $SiO_2$, and materials composed of silicon dioxide). Examples to be given of the hollow filler are organic balloon such as acrylic balloon or the like, perlite balloon, fly ash balloon, Sirus balloon, glass balloon and so on. Here, the perlite balloon is an artificial foam formed by subjecting crude perlite rock produced as volcanic rock or diatomaceous earth or the like to a high temperature treatment.

By using (adding) the permittivity adjusting filler 3, the relative permittivity of the thermally conductive sheet 1 can be reduced. Now, the reason why the relative permittivity of the thermal conductive sheet 1 can be reduced when a hollow filler is contained as the permittivity adjusting filler 3 is because the inside of the hollow filler is a gas and therefore its relative permittivity is low. Examples to be given of the high permeability filler 4 are metal oxide fillers such as soft ferrite or the like. Here, among ferrites (a generic term for ceramics containing iron oxide as a main ingredient), the soft ferrite means those with soft magnetism. By using the high permeability filler 4, the relative permeability of the thermally conductive sheet 1 can be increased. Further, as described in detail later, the relative permeability of the thermally conductive sheet 1 can have an imaginary part ($\mu''$) due to the increase of the relative permeability of the thermally conductive sheet 1 by using the high permeability filler 4 as described above. The presence of the imaginary part allows a part of energy of electromagnetic wave to be converted to heat, thereby making it possible to enhance the electromagnetic wave reduction effect.

The thermally conductive sheet 1 according to the present embodiment can contain a filler to adjust the thermal conductivity (hereafter referred to as "thermally conductive filler") and a filler to adjust the viscosity (hereafter referred to as "viscosity adjusting filler") in addition to the permittivity adjusting filler 3 and the high permeability filler 4. Examples to be given of the thermally conductive filler are aluminum hydroxide, which is inexpensive, as well as alumina, silicon carbide, magnesium hydroxide and so on. Note that boron nitride used as the permittivity adjusting filler 3 can also be used at the same time as the thermally conductive filler.

By adding the thermally conductive filler to the thermally conductive sheet 1, the thermal conductivity of the entire thermal conductive sheet 1 can be made higher than the thermal conductivity of the base material 2. By thus increasing the thermal conductivity of the thermally conductive sheet 1, heat is less likely to be stored in the heat source such as components or the like in contact with the thermally conductive sheet 1. Further, since heat is less likely to be stored in the heat source such as the components or the like, their heat resistance and durability can be improved thereby. Further, depending on the material of the heat source, its thermal expansion can be reduced, and thereby its distortion can be reduced. Other effects are that since heat is less likely to be stored, progress in its chemical degradation (or corrosion) can be prevented, and a device user can be prevented from accidents such as low temperature burn injury and the like.

Further, examples to be given of the viscosity adjusting filler are magnesium hydroxide, which also serves as a thermally conductive filler, and so on. By adding the viscosity adjusting filler such as magnesium hydroxide to the thermally conductive sheet 1, the viscosity of the entire thermally conductive sheet 1 can be increased. By increasing the viscosity of the entire thermally conductive sheet 1, the separation of the fillers contained in the thermally conductive sheet 1 can be reduced. Further, by adjusting its fluidity not to be excessively high, the dimensional stability in forming the thermally conductive sheet 1 is improved, and as a result, the yield rate (good product rate) can be improved.

(Method of Manufacturing Thermally Conductive Sheet)

Next, an exemplary method of manufacturing a thermally conductive sheet 1 will be described. First, an ingredient for a base material 2 such as an acrylic resin is mixed and kneaded with fillers such as a permittivity adjusting filler 3, a high permeability filler 4 and so on to make a thermally conductive material comprising a base material 2 having various fillers homogeneously dispersed therein. Then, the thermally conductive material is formed into a sheet shape, and thereby a thermally conductive sheet 1 can be obtained. By being formed into a sheet shape, the thermally conductive material more easily follows fine irregularities on the surface of a heat source and a heat dissipation device, making it possible to reduce its contact thermal resistance with the heat source and the heat dissipation device. In addition, the sheet shape is effective to improve the work efficiency in attaching the thermally conductive sheet 1 to the heat source and the heat dissipation device, and also effective to reduce a load to an object on which to attach it.

Applicable methods of mixing described above are a kneading method using a machine such as a vacuum defoaming mixer, and various other methods using, for example, an extrusion kneader, a two roll, a kneader, a Banbury mixer and so on. Applicable methods of forming described above are forming methods using a machine such as a coater, a calendar roll, an extrusion kneader, a press and so on, and various other methods. Among these methods, the forming method using a coater is desirable because it makes it easy to manufacture a thin sheet, and is suitable for mass production due to its high productivity, and also makes it easy to achieve accuracy in sheet thickness.

(Example of Using Thermally Conductive Sheet)

Figure 2:
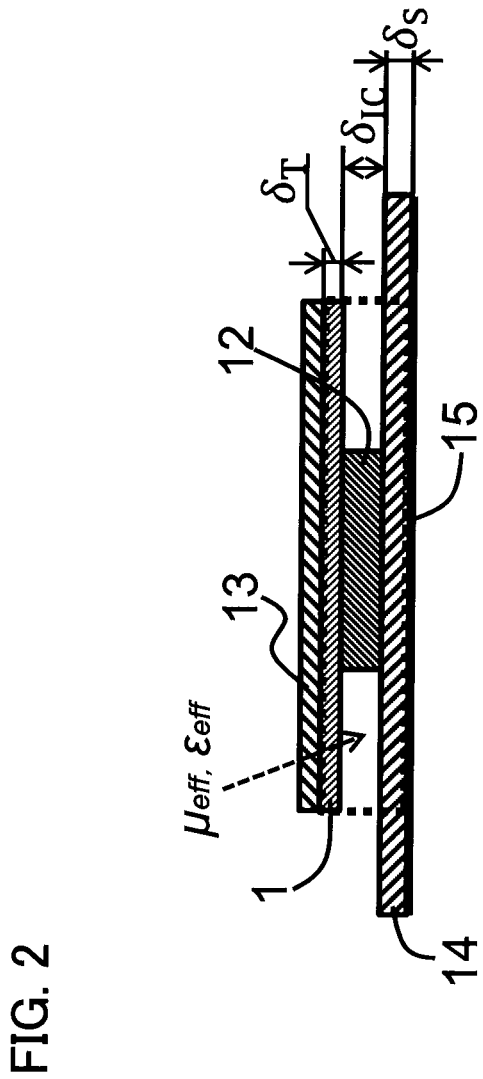
FIG. 2 is a schematic cross-sectional view of the thermally conductive sheet and other elements around the thermally conductive sheet for explaining how to use the thermally conductive sheet.

Next, an example of using the thermally conductive sheet 1 according to the present embodiment will be described with reference to FIG. 2, which is a schematic cross-sectional view of the thermally conductive sheet 1 and other elements around the thermally conductive sheet 1 for explaining how to use the thermally conductive sheet 1. Referring to FIG. 2, the thermally conductive sheet 1 is used and sandwiched between an IC (Integrated Circuit) 12 such as MPU (Micro Processing Unit) or the like and a heat sink 13. This use allows upper and lower surfaces of the thermally conductive sheet 1 (as shown) to be in contact with a lower surface of the heat sink 13 and an upper surface of the IC 12, respectively, and therefore the thermally conductive sheet 1 can efficiently release heat from the IC 12 as a heat source to the heat sink 13. Note that referring to FIG. 2, the IC 12 is mounted on a printed circuit board 14, where the lowermost layer of the printed circuit board 14 is formed as a ground layer 15. In FIG. 2, $\delta_T$, $\delta_{IC}$ and $\delta_S$ represent the thicknesses of the thermally conductive sheet 1, the IC 12 and the printed circuit board 14, respectively. Further, in FIG. 2, $\mu_{eff}$ and $\mu_{eff}$ represent an average relative permeability and an average permittivity, respectively, of the materials (thermally conductive sheet 1, IC 12, printed circuit board 14 and air) between the heat sink 13 and the ground layer 15 (of the printed circuit board 14). Note that in FIG. 2, the area between the dashed lines represents the above-described materials between the heat sink 13 and the ground layer 15.

When a conventional thermally conductive sheet is used in the manner described above, a problem occurs that the heat sink resonates with an electromagnetic wave generated by the IC and works as a kind of antenna to generate a stronger electromagnetic wave. However, the thermally conductive sheet 1 according to the present embodiment uses the high permeability filler 4 to allow the relative permeability of the entire thermally conductive sheet 1 to exceed 1, thereby making it possible to reduce an electromagnetic wave in a high frequency range above about 1 GHz. Further, the use of the permittivity adjusting filler 3 to reduce the relative permittivity of the entire thermally conductive sheet to a value as low as 7 or lower makes it possible that by sandwiching the thermally conductive sheet 1 between the IC 12 and the heat sink 13, the electrostatic capacitance between the IC 12 and the heat sink 13 is reduced. This can make it difficult to transfer the electromagnetic wave emitted from the IC 12 to the heat sink 13, making it possible to reduce the electromagnetic wave emitted from the heat sink 13.

By reducing the relative permittivity of the entire thermally conductive sheet 1 to a value as low as 7 or lower as described above, it is possible to enhance the electromagnetic wave reduction effect, particularly in a relatively low frequency range (for example, a frequency range below 1 GHz). The reason for this is as follows. Specifically, as the relative permittivity of the thermally conductive sheet 1 sandwiched between the IC 12 and the heat sink 13 increases, the resonant frequency of the heat sink 13 shifts to a lower frequency. Therefore, in a relatively low frequency range described above, the electric field strength of the electromagnetic wave from the heat sink 13 increases as the relative permittivity increases. In contrast, according to the thermally conductive sheet 1 of the present embodiment, the relative permittivity is designed to have a value as low as 7 or lower, thereby making it possible to shift the resonant frequency of the heat sink 13 to a higher frequency. This makes it possible to enhance the electromagnetic wave reduction effect in a relatively low frequency range (for example, a frequency range below 1 GHz) as described above. Thus, the thermally conductive sheet 1 according to the present embodiment can reduce an electromagnetic wave regardless of the frequency range.

EXAMPLES

Hereinafter, by using Examples, the thermally conductive sheet will be described in more detail.

Example 1

General-use acrylic polymer was used as the base material 2 of the thermally conductive sheet 1 of Example 1. Further, perlite balloon was used as the permittivity adjusting filler 3, and two kinds of Ni—Zn soft ferrites with different particle sizes were used as the high permeability filler 4. The mixing ratio of each filler to the base material 2 was such that the mixing ratio of acrylic polymer was about 14 wt %, and that of perlite balloon was about 6 wt %, while that of the Ni—Zn soft ferrite with the larger particle size was about 27 wt %, and that of the Ni—Zn soft ferrite with the smaller particle size was about 53 wt %. To the thermally conductive sheet 1, furthermore, additives such as an antioxidant, a crosslinking agent, a multifunctional monomer and so on were added. The mixing ratio of each additive to the base material 2 was such that the mixing ratio of the antioxidant was about 0.05 wt %, and that of the crosslinking agent was about 0.14 wt % while that of the multifunctional monomer was about 0.02 wt %. As shown in FIG. 3, the relative permittivity and the relative permeability of the thermally conductive sheet 1 of Example 1 were 7.0 and 7, respectively.

Example 2

General-use acrylic polymer was used as the base material 2 of the thermally conductive sheet 1 of Example 2. Further, acrylic group balloon (product name: "Expancel 920 DE 40 d30" made by Akzo Nobel Pulp and Performance Chemicals AB), which is a kind of organic balloon, was used as the permittivity adjusting filler 3, and two kinds of Ni—Zn soft ferrites with different particle sizes were used as the high permeability filler 4. Further, to the thermally conductive sheet 1, inexpensive aluminum hydroxide was added as a thermally conductive filler, and magnesium hydroxide serving to increase the viscosity was added as a viscosity adjusting filler. The mixing ratio of each filler to the base material 2 was such that the mixing ratio of acrylic polymer was about 11 wt %, that of aluminum hydroxide was about 4 wt %, that of magnesium hydroxide was about 3 wt %, and that of acrylic group balloon was about 0.3 wt %, while that of the Ni—Zn soft ferrite with the larger particle size was about 27 wt %, and that of the Ni—Zn soft ferrite with the smaller particle size was about 54 wt %. To the thermally conductive sheet 1, furthermore, additives such as an antioxidant, a crosslinking agent, a multifunctional monomer and so on were added. The mixing ratio of each additive to the base material 2 was such that the mixing ratio of the antioxidant was about 0.04 wt %, and that of the crosslinking agent was about 0.11 wt % while that of the multifunctional monomer was about 0.01 wt %. As shown in FIG. 3, the relative permittivity and the relative permeability of the thermally conductive sheet 1 of Example 2 were 7.0 and 7, respectively.

Comparative Example 1

The materials of the base material and the high permeability filler used for the thermally conductive sheet of Comparative Example 1 were the same as those used for the thermally conductive sheet 1 of Example 1, except that in contrast to the thermally conductive sheet 1 of Example 1, perlite balloon as a permittivity adjusting filler was not added to the thermally conductive sheet of Comparative Example 1. As shown in FIG. 3, the relative permittivity and the relative permeability of the thermally conductive sheet of Comparative Example 1 were 10.8 and 13, respectively. The thermally conductive sheet of Comparative Example 1 had a higher relative permittivity than the thermally conductive sheet 1 of Example 1 because perlite balloon as a permittivity adjusting filler was not added thereto.

Comparative Example 2

General-use silicone resin was used as the base material, and silicon carbide was used as the thermally conductive filler of the thermally conductive sheet of Comparative Example 2, respectively. As shown in FIG. 3, the thermally conductive sheet of Comparative Example 2 had a high relative permittivity value of 34.0 due to the addition of silicon carbide. Further, in contrast to the thermally conductive sheet 1 of Example 1, the high permeability filler and the permittivity adjusting filler were not added to the thermally conductive sheet of Comparative Example 2. Due to the absence of the high permeability filler, the thermally conductive sheet of Comparative Example 2 had a relative permeability of 1 as shown in FIG. 3.

Comparative Example 3

General-use acrylic polymer was used as the base material of the thermally conductive sheet of Comparative Example 3. Like the thermally conductive sheet 1 of Example 1, perlite balloon as the permittivity adjusting filler was added to the thermally conductive sheet of Comparative Example 3, while the high permeability filler was not added thereto in contrast to the thermally conductive sheet 1 of Example 1. This caused that the thermally conductive sheet of Comparative Example 3 had a low relative permittivity value of 2.1 and a relative permeability of 1 as shown in FIG. 3. Note that, like the thermally conductive sheet 1 of Example 1, the thermally conductive filler was not added to the thermally conductive sheet of Comparative Example 3.

(Measurement of Electric Field Strength of Electromagnetic Wave)

Figure 4:
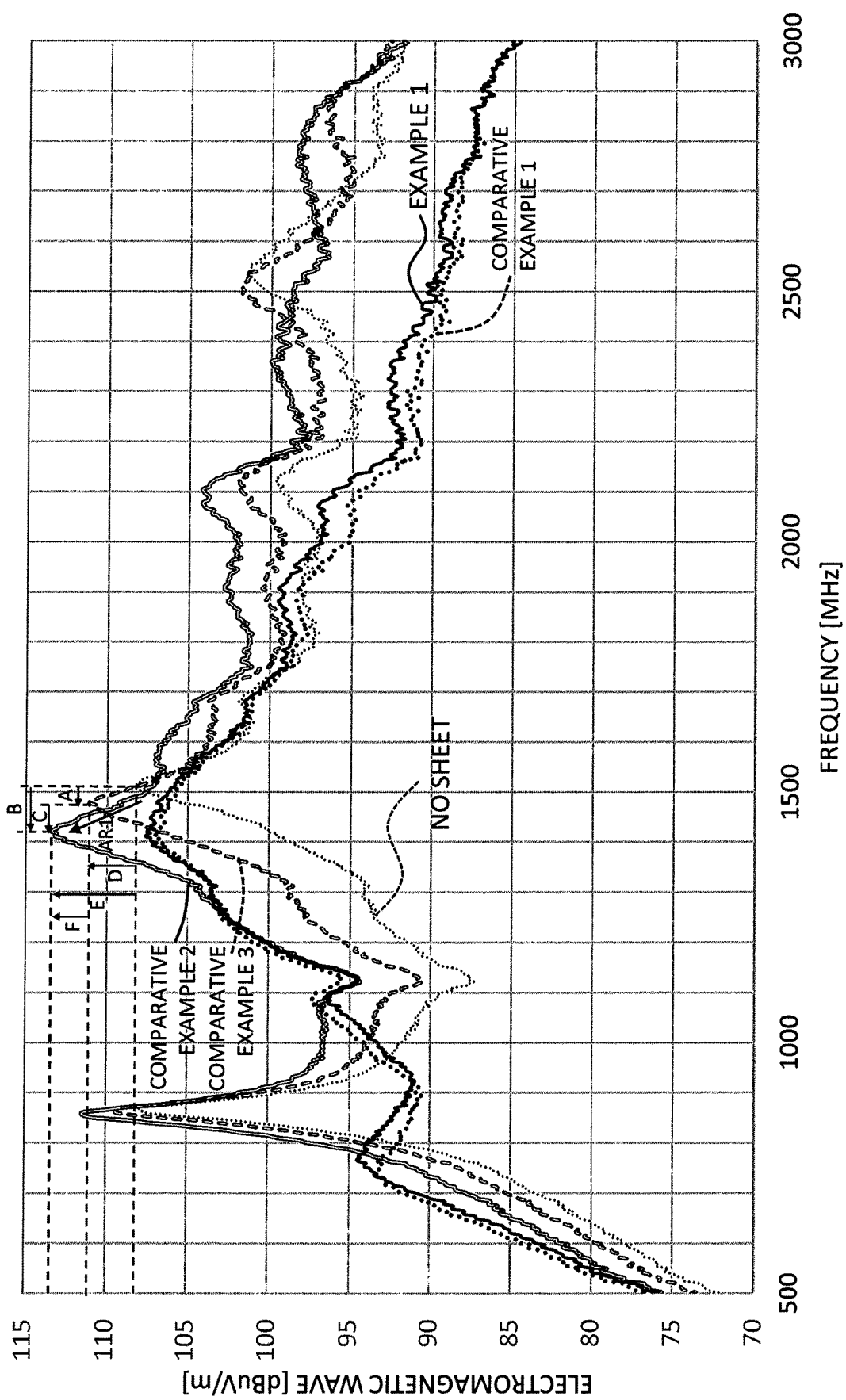
FIG. 4 is a graph showing results of measurements of electromagnetic waves from a heat sink with an area of 150 mm×150 mm when using the respective thermally conductive sheets of Example 1 and Comparative Examples 1 to 3.
Figure 5:
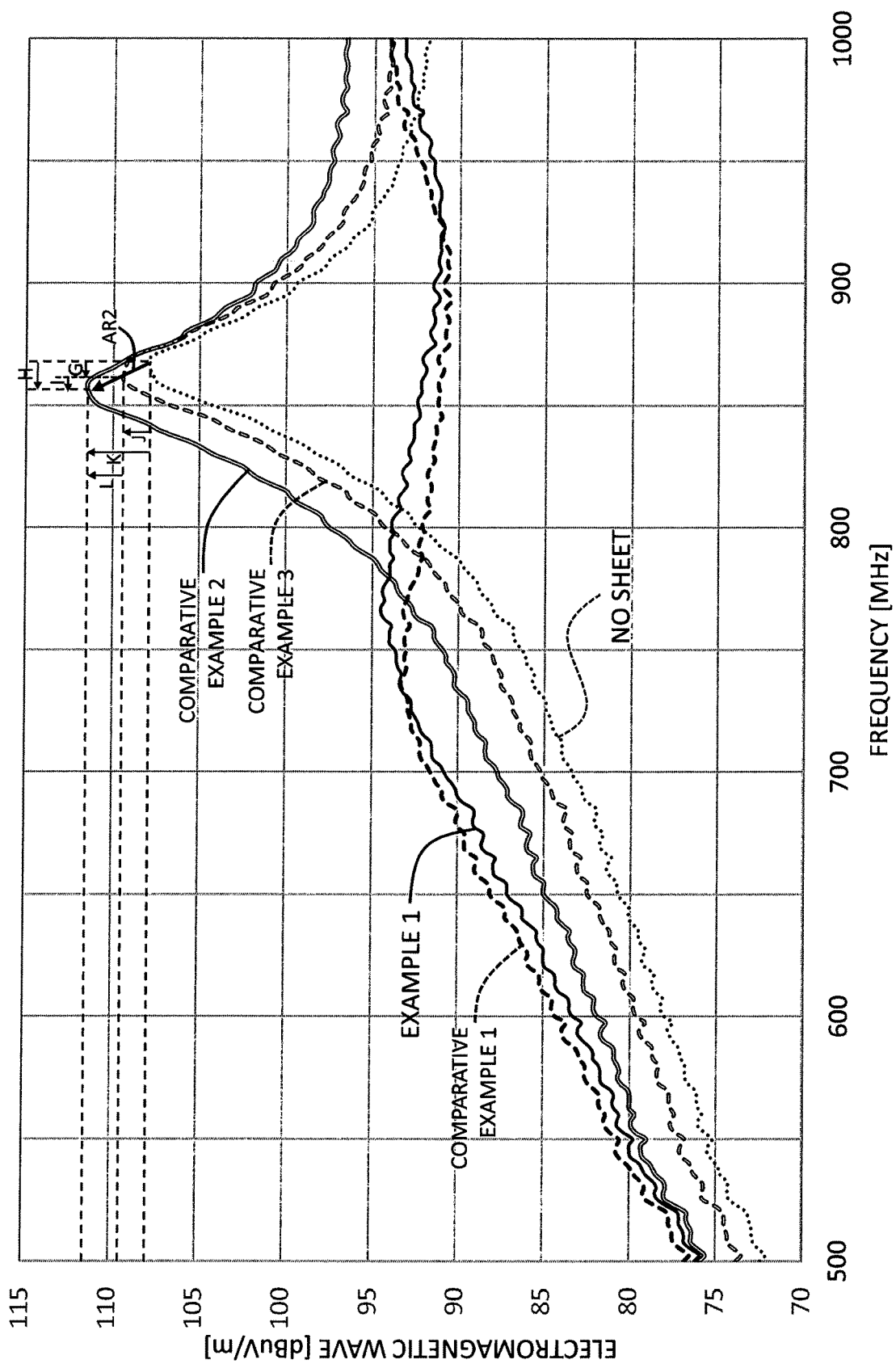
FIG. 5 is a graph showing a part of each electromagnetic wave of FIG. 4 below 1 GHz in an enlarged scale.

Test pieces each with an area of 30 mm×30 mm×3.5 mm were cut out of the thermally conductive sheet 1 of Example 1 above and the thermally conductive sheets of Comparative Examples 1 to 3 above. Each sheet (test piece) was sandwiched between the heat sink 13 with an area of 150 mm×150 mm and the IC 12, and subjected to a measurement of electric field strength of an electromagnetic wave from the heat sink 13. FIG. 4 and FIG. 5 show the results of measurements of electric field strength of the electromagnetic waves. FIG. 5 is a graph showing a part of each electromagnetic wave of FIG. 4 below 1 GHz in an enlarged scale. Among the curves shown in FIG. 4 and FIG. 5, each curve indicated as "no sheet" shows the results of measurements in the case where no thermally conductive sheet was sandwiched between the heat sink 13 and the IC 12, and a gap equal to the thickness of the thermally conductive sheet was provided (only air was present) between them.

First, referring to FIG. 4 and FIG. 5, the influence of the magnitude of the relative permittivity of each thermally conductive sheet on the electromagnetic wave reduction function or effect will be described. For the sake of convenience of description, the description will be focused on the curves for the thermally conductive sheets of Comparative Examples 2 and 3 in which the relative permeability is 1 as shown in FIG. 3 and on the curves for "no sheet", among the curves shown in FIG. 4 and FIG. 5 showing the results of measurements Here, it is considered that the case of no sheet can be described as a case where, in place of the thermally conductive sheet, air with a permittivity of about 1 is sandwiched. Therefore, also considering the relative permittivities shown in FIG. 3, the relative permittivity increases in the order from no sheet (air), the thermally conductive sheet of Comparative Example 3, and the thermally conductive sheet of Comparative Example 2.

Further, as seen from the curves shown in FIG. 4 showing the results of measurements, the magnitude of the electromagnetic wave from the heat sink 13 increases in the order from no sheet (air), the thermally conductive sheet of Comparative Example 3, and the thermally conductive sheet of Comparative Example 2, at least in the case of the electromagnetic wave in a frequency range below 1.4 GHz. Thus, it could be confirmed that at least the electromagnetic wave in a frequency range below 1.4 GHz increases in magnitude as the relative permittivity of the thermally conductive sheet sandwiched between the heat sink 13 and the IC 12 increases. In other words, it was confirmed that by reducing the relative permittivity of the thermally conductive sheet sandwiched between the heat sink 13 and the IC 12, the electromagnetic wave from the heat sink 13 can be reduced at least in its frequency range below 1.4 GHz.

This point will be described in more detail below. Focusing on the resonances present around a frequency of 1.4 GHz to 1.5 GHz in FIG. 4 (corresponding to the second (from left) resonance of the waveform for "no sheet"), the resonance peaks for "no sheet", the thermally conductive sheet of Comparative Example 3 and the thermally conductive sheet of Comparative Example 2 shift diagonally left upward as shown by arrow AR1 in FIG. 4 in ascending order of relative permittivity of these thermally conductive sheets (or air). More specifically, in the case of the thermally conductive sheet of Comparative Example 3 having a relative permittivity of 2.1, the frequency of the resonance peak moves to a lower frequency by an amount indicated by arrow A, while the electromagnetic wave from the heat sink 13 increases in magnitude by an amount indicated by arrow D, as compared with the case of no sheet (where only air with a relative permittivity of about 1 is sandwiched).

Further, in the case of the thermally conductive sheet of Comparative Example 2 having a relative permittivity of 34.0, the frequency of the resonance peak moves to a lower frequency by an amount indicated by arrow B, while the electromagnetic wave from the heat sink 13 increases in magnitude by an amount indicated by arrow E, as compared with the case of no sheet. Thus, in the case of the thermally conductive sheet of Comparative Example 2 having a relative permittivity of 34.0, the frequency of the resonance peak moves to a lower frequency by an amount indicated by arrow C, while the electromagnetic wave from the heat sink 13 increases in magnitude by an amount indicated by arrow F, as compared with the case of the thermally conductive sheet of Comparative Example 3 having a relative permittivity of 2.1.

Similarly, regarding the resonances present in a frequency range of 850 MHz to 900 MHz in FIG. 5 (corresponding to the first (from left) resonance of the waveform for "no sheet"), the resonance peaks for "no sheet", the thermally conductive sheet of Comparative Example 3 and the thermally conductive sheet of Comparative Example 2 shift diagonally left upward as shown by arrow AR2 in FIG. 5 in this order, namely, in ascending order of relative permittivity of these thermally conductive sheets (or air). More specifically, in the case of the thermally conductive sheet of Comparative Example 3 having a relative permittivity of 2.1, the frequency of the resonance peak moves to a lower frequency by an amount indicated by arrow G, while the electromagnetic wave from the heat sink 13 increases in magnitude by an amount indicated by arrow J, as compared with the case of no sheet (where only air with a relative permittivity of about 1 is sandwiched).

Further, in the case of the thermally conductive sheet of Comparative Example 2 having a relative permittivity of 34.0, the frequency of the resonance peak moves to a lower frequency by an amount indicated by arrow H, while the electromagnetic wave from the heat sink 13 increases in magnitude by an amount indicated by arrow K, as compared with the case of no sheet. Thus, in the case of the thermally conductive sheet of Comparative Example 2 having a relative permittivity of 34.0, the frequency of the resonance peak moves to a lower frequency by an amount indicated by arrow I, while the electromagnetic wave from the heat sink 13 increases in magnitude by an amount indicated by arrow L, as compared with the case of the thermally conductive sheet of Comparative Example 3 having a relative permittivity of 2.1.

In the case where the relative permeabilities of the thermally conductive sheets sandwiched between the heat sink 13 and the IC 12 are the same as described above, the electromagnetic wave reduction function or effect at least in a frequency range below 1.4 GHz increases with a decrease in the permittivity of the thermally conductive sheet. The first reason for this is that as the relative permittivity of the thermally conductive sheet is reduced, the thermally conductive sheet sandwiched between the heat sink 13 and the IC 12 reduces the electrostatic capacitance between the heat sink 13 and the IC 12, which can make it difficult to transfer the electromagnetic wave emitted from the IC 12 to the heat sink 13, making it possible to reduce the electromagnetic wave emitted from the heat sink 13. The second reason is that when the relative permeabilities of the thermally conductive sheets are the same, it is possible to increase the frequency of the first (leftmost in the graph) resonance (that is, move it to the right side of the graph) as the relative permittivity of the thermally conductive sheet is lower, and therefore, a higher electromagnetic wave reduction effect due to the reduction in relative permittivity of the thermally conductive sheet is obtained for the electromagnetic wave particularly in a frequency range below the frequency of the first resonance.

Figure 6:
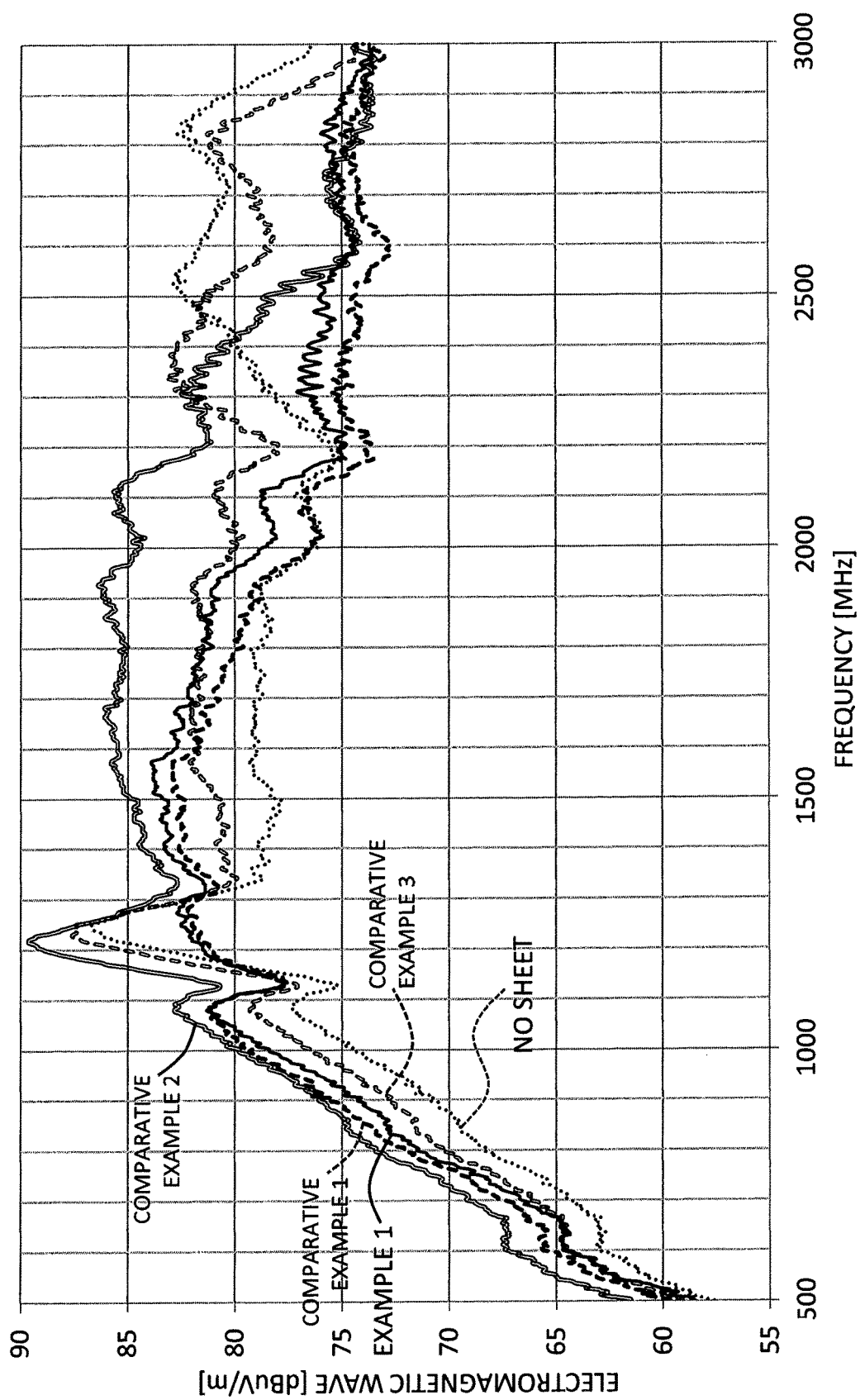
FIG. 6 is a graph showing results of measurements of electromagnetic waves from a heat sink with an area of 100 mm×100 mm when using the respective thermally conductive sheets of Example 1 and Comparative Examples 1 to 3.

Next, referring to FIG. 6 which shows the results of measurements when the area of the heat sink 13, among the above-described test conditions for obtaining the measurement results data shown in FIG. 4 and FIG. 5, was changed to 100 mm×100 mm, the influence of the magnitude of the relative permittivity of each thermally conductive sheet on the electromagnetic wave reduction function or effect will be described. As shown in FIG. 6, it could be confirmed that when the area of the heat sink 13 is changed to 100 mm 100 mm, at least the electromagnetic wave in a frequency range below 1 GHz is reduced as the relative permittivity of the thermally conductive sheet sandwiched between the heat sink 13 and the IC 12 is lower (that is, the magnitude of the electromagnetic wave decreases in the order of Comparative Example 2, Comparative Example 1, Example 1, Comparative Example 3 and "no sheet"). In other words, it was confirmed that the electromagnetic wave from the heat sink 13, at least in a frequency range below 1 GHz, can be reduced by reducing the relative permittivity of the thermally conductive sheet sandwiched between the heat sink 13 and the IC 12.

Thus, from the results of the measurements shown in FIG. 4 to FIG. 6 in their entirety, it was confirmed that the electromagnetic wave from the heat sink 13, at least in a frequency range below 1 GHz, can be reduced by reducing the relative permittivity of the thermally conductive sheet sandwiched between the heat sink 13 and the IC 12. However, by only reducing the relative permittivity of the thermally conductive sheet, it is difficult to reduce the electromagnetic wave in a frequency range above about 1 GHz, and the electromagnetic wave reduction effect near the peak of the resonance is limited. Thus, the thermally conductive sheet 1 of Example 1 uses soft ferrite as the high permeability filler 4 so as to increase the relative permeability of the entire thermally conductive sheet 1 to 7 or higher, thereby reducing the electromagnetic wave in a high frequency range above about 1 GHz, and making it possible to enhance the electromagnetic wave reduction effect near the peak of the resonance of the electromagnetic wave.

Next, referring to FIG. 4 to FIG. 6, the influence of the magnitude of the relative permittivity of each thermally conductive sheet, including the thermally conductive sheet 1 of Example 1, on the electromagnetic wave reduction function or effect will be described. First, from the results of the measurements shown in FIG. 4 to FIG. 6, it could be confirmed that the thermally conductive sheet 1 of Example 1 and the thermally conductive sheet of Comparative Example 1 having a clearly higher relative permeability than air have a higher average electromagnetic wave reduction effect in the entire frequency range of 500 MHz to 3 GHz than the thermally conductive sheets of Comparative Example 2 and Comparative Example 3 having a relative permeability of 1 (the same relative permeability as air).

It could be further confirmed that the thermally conductive sheet 1 of Example 1 and the thermally conductive sheet of Comparative Example 1 having a higher relative permeability have a higher electromagnetic wave reduction effect as the frequency range of the electromagnetic wave increases. Particularly, in a high frequency range above 2 GHz, the thermally conductive sheet 1 of Example 1 and the thermally conductive sheet of Comparative Example 1 having a higher relative permeability can reduce the magnitude of the electromagnetic wave from the heat sink 13 further than the case of "no sheet". Note that comparing the thermally conductive sheet 1 of Example 1 and the thermally conductive sheet of Comparative Example 1, the thermally conductive sheet of Comparative Example 1 has a higher relative permeability, and thus, referring to the graphs of FIG. 4 and FIG. 6, the thermally conductive sheet of Comparative Example 1 having the higher relative permeability can reduce the electromagnetic wave from the heat sink 13 as compared with the thermally conductive sheet 1 of Example 1 in a high frequency range.

From the results of the measurements shown in FIG. 4 to FIG. 6, it could be further confirmed that the thermally conductive sheet 1 of Example 1 and the thermally conductive sheet of Comparative Example 1 having a higher relative permeability have a higher electromagnetic wave reduction effect near the peak of the resonance as compared with the thermally conductive sheets of Comparative Example 2 and Comparative Example 3 having a relative permeability of 1. For example, focusing on the first (leftmost in the graph) resonance shown in FIG. 4 and FIG. 5, it could be confirmed that in the case of using the thermally conductive sheet 1 of Example 1 and the thermally conductive sheet of Comparative Example 1 having a higher relative permeability, the electromagnetic wave near the peak of this resonance is significantly reduced than in the case of using the thermally conductive sheets of Comparative Example 2 and Comparative Example 3 having a relative permeability of 1 and in the case of "no sheet".

As described above, it was confirmed from the results of the measurements shown in FIG. 4 to FIG. 6 that the electromagnetic wave from the heat sink 13, at least in a frequency range below 1 GHz, can be reduced as the relative permittivity of the thermally conductive sheet sandwiched between the heat sink 13 and the IC 12 is lower. It could also be confirmed from the results of the measurements described above that as the relative permeability of the thermally conductive sheet sandwiched between the heat sink 13 and the IC 12 is higher, the average electromagnetic wave reduction effect in the entire frequency range of 500 MHz to 3 GHz is higher, and this reduction effect is particularly higher in the case of the electromagnetic wave in a high frequency range.

In addition, it could be confirmed that due to having a relative permeability of 7 by using soft ferrite, the thermally conductive sheet 1 of Example 1 has a high effect of average electromagnetic wave reduction in the entire frequency range of 500 MHz to 3 GHz, and this reduction effect is particularly higher in the case of the electromagnetic wave in a high frequency range. Furthermore, it could be confirmed that due to having a reduced relative permittivity (relative permittivity reduced to 7.0) by using perlite balloon as the permittivity adjusting filler 3, the thermally conductive sheet 1 of Example 1 has a high electromagnetic wave reduction effect in a frequency range below about 1 GHz.

Note that as described above, by only reducing the relative permittivity of the thermally conductive sheet, it is difficult to sufficiently reduce the electromagnetic wave near the peak of the resonance among the electromagnetic waves in a frequency range below 1 GHz. However, due to having a high relative permeability as described above, the thermally conductive sheet 1 of Example 1 could sufficiently reduce the electromagnetic wave near the peak of the resonance as well. Thus, the thermally conductive sheet 1 of Example 1 could reduce the electromagnetic wave regardless of the frequency range of the electromagnetic wave. Further, it was conformed from the experiments that similarly as in the case of the thermally conductive sheet 1 of Example 1, the thermally conductive 1 of Example 2 can also reduce the electromagnetic wave regardless of the frequency range. It could also be confirmed from the experiments of Examples 1 and 2 that if the relative permittivity of the thermally conductive sheet 1 is 7 or lower, the electromagnetic wave in a frequency range below about 1 GHz can be reduced.

(Study of Electromagnetic Wave Reduction Effect near Peak of Resonance)

Next, the reason why the thermally conductive sheets 1 of Example 1 and Example 2 can sufficiently reduce the electromagnetic wave near the peak of the resonance will be described in detail with reference to FIG. 7 which is a graph showing results of simulations of electric field strengths of electromagnetic waves from the heat sink 13 when using the thermally conductive sheet 1 and when only the permeability loss tan δ of the thermally conductive sheet was changed. In these simulations, the thickness $\delta_T$ of the thermally conductive sheet 1, the thickness $\delta_{IC}$ of the IC 12 and the thickness $\delta_S$ of the printed circuit board 14 in FIG. 2 were set to 1 mm, 2 mm and 1.6 mm, respectively. The area of each of the thermally conductive sheet 1 and the heat sink 13 was set to 50 mm×50 mm, and the area of the IC 12 was set to 30 mm×30 mm.

The relative permittivities of the IC 12 and the printed circuit board 14 were set to 3 and 4, respectively, while the relative permeability of each of the IC 12 and the printed circuit board 14 was set to 1. Further, the real part ε' of the relative permittivity (complex relative permittivity) and the real part μ' of the relative permeability of the thermally conductive sheet 1 were each set to 5. By changing only the permeability loss (loss factor) tan δ, the influence of the magnitude of the permeability loss tan δ on the electromagnetic wave reduction effect near the peak of the resonance was investigated. Here, the permeability loss tan δ represents a ratio (μ"/μ') of the imaginary part to the real part of the relative permeability (μ'−jμ").

Figure 7:
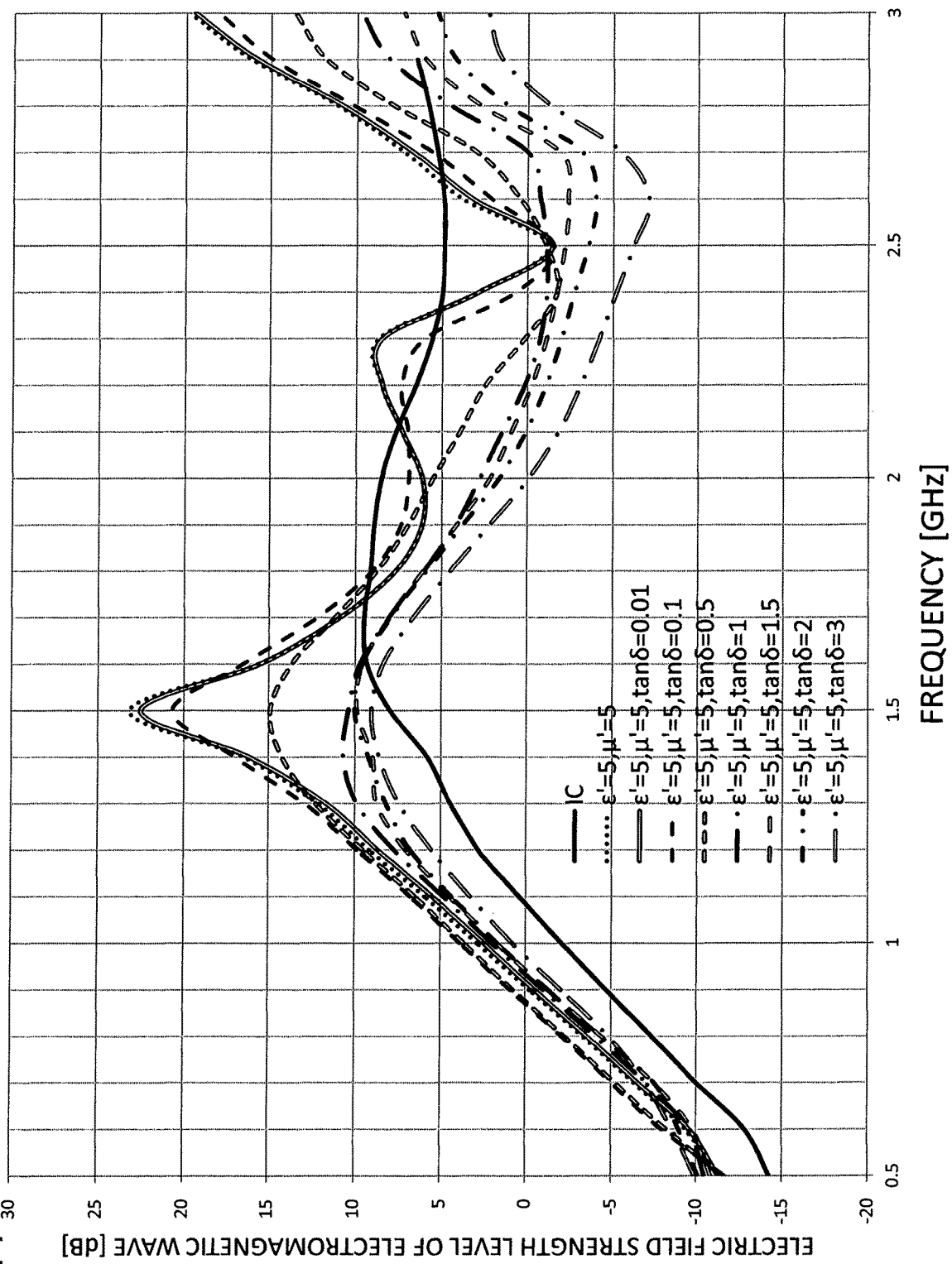
FIG. 7 is a graph showing results of simulations of electric field strengths of electromagnetic waves from a heat sink with an area of 50 mm 50 mm when using the thermally conductive sheet of the embodiment of the present invention, and when only the permeability loss tan δ of the thermally conductive sheet is changed.

From the results of the simulations shown in FIG. 7, it was found that when the real part of the relative permeability of the thermally conductive sheet 1 is the same, the resonant frequency does not shift even if the permeability loss tan δ increases (the imaginary part of the relative permeability increases), but that the increase in the permeability loss tan δ causes the electric field strength of the electromagnetic wave from the heat sink 13 to be significantly attenuated. The reason for this is that to increase the permeability loss tan δ while keeping the value of the real part μ' of the relative permeability at a constant value like these simulations is to increase the imaginary part μ" of the relative permeability, and that as the imaginary part μ" increases, the percentage of energy converted to heat energy in the total electromagnetic wave energy increases. In addition, generally an increase in the real part μ' of the relative permeability causes a higher increase in its imaginary part μ", and therefore, the imaginary part μ" of a thermally conductive sheet having a high relative permeability (its real part μ') like the thermally conductive sheets 1 of Examples 1 and 2 described above has a higher value. Thus, the thermally conductive sheet having a high relative permeability like the thermally conductive sheets 1 of Examples 1 and 2 can sufficiently reduce the electromagnetic wave near the peak of the resonance described above.

Note that in the simulations shown in FIG. 7, the resonant frequency $f_{mn}$ of the heat sink 13 (more precisely, the resonant frequency of the resonator composed of the materials (the heat sink 13, the thermally conductive sheet 1, the IC 12, the printed circuit board 14 and air) between the heat sink 13 and the ground layer 15 (of the printed circuit board 14) in FIG. 2) was calculated using the following Equation (1):

$$f_{mn} = \frac{1}{2a\sqrt{\varepsilon_0 \mu_0 \varepsilon_{eff} \mu_{eff}}} \sqrt{m^2 + n^2} \quad (1)$$

In Equation (1) above, $\varepsilon_0$ and $\mu_0$ represent permittivity and permeability, respectively, in vacuum. Further, as described above with reference to FIG. 2, $\mu_{eff}$ and $\mu_{eff}$ represent average relative permeability and average relative permittivity of a material between the heat sink 13 and the ground layer 15. Further, in Equation (1), a represents length of each vertical and horizontal side of a square when the heat sink 13 (heat dissipation plate) has a square shape. In addition, in Equation (1), in and n (each being an integer) represent resonance modes corresponding to lengths of the vertical and horizontal sides of the heat sink 13, respectively, among the resonance modes of the heat sink 13. Among the resonance modes of the heat sink 13, the resonant frequency $f_{mn}$ in the mode (m=1, n=1), which is the lowest mode, corresponds to the first (lowest) resonant frequency shown in FIG. 7.

MODIFIED EXAMPLES

It is to be noted that the present invention is not limited to the above-described embodiment, and various modifications are possible within the spirit and scope of the present invention. Modified examples of the present invention will be described below.

Modified Example 1

The examples of the embodiment described above are those in which the thermally conductive composition contains both the permittivity adjusting filler 3 having a lower permittivity than the base material and the high permeability filler 4 having a higher permeability than the base material. However, the thermally conductive composition of the present invention is not limited thereto, and can be one which contains only either the permittivity adjusting filler having a lower permittivity than the base material or the high permeability filler having a higher permeability than the base material. This structure also can make the thermally conductive composition have a relative permeability higher than 1 and a relative permittivity of 7 or lower, for example, by using a combination of a high permeability filler and a base material having a lower permittivity than a normal base material (such as acrylic resin, silicone resin or the like), or by using a combination of a permittivity adjusting filler and a base material having a higher permeability than a normal base material.

Modified Example 2

The examples of the embodiment shown above are those in which, among the permittivity adjusting filler and the high permeability filler, the permittivity adjusting filler is a hollow filler having an air region inside. However, instead, the high permeability filler can be configured to be a hollow filler having an air region inside. This configuration enables the high permeability filler to also function as the permittivity adjusting filler (function to reduce the permittivity). Therefore, the permittivity adjusting filler can be reduced in amount, and similarly as in Modified Example 1 above, it is also possible prevent the permittivity adjusting filler from being contained. Furthermore, it is also possible that both the permittivity adjusting filler and the high permeability filler are hollow fillers having an air region inside.

Modified Example 3

The examples of the embodiment shown above are those in which the thermally conductive composition (thermally conductive sheet) contains a thermally conductive filler, or in which the permittivity adjusting filler is used also as the thermally conductive filler. However, the thermally conductive composition of the present invention is not limited thereto. For example, the high permeability filler can be used also as the thermally conductive filler, and it is also possible to use a base material having a higher thermal conductivity than a normal base material (such as acrylic resin, silicone resin or the like).

Modified Example 4

The examples of the embodiment shown above are those in which the thermally conductive composition is the thermally conductive sheet 1. However, the thermally conductive composition of the present invention is not limited to those having a sheet shape.

These and other modifications will become obvious, evident or apparent to those ordinarily skilled in the art, who have read the description. Accordingly, the appended claims should be interpreted to cover all modifications and variations which fall within the spirit and scope of the present invention.

The invention claimed is:

1. A thermally conductive composition comprising:
   a base material; and
   at least one of a permittivity adjusting filler having a lower permittivity than the base material and a high permeability filler having a higher permeability than the base material,
   wherein the entire thermally conductive composition has a relative permeability higher than 1 and a relative permittivity of 7 or lower.

2. The thermally conductive composition according to claim 1, wherein a thermal conductivity of entirety of the thermally conductive composition is higher than a thermal conductivity of the base material.

3. The thermally conductive composition according to claim 1, wherein at least one of the permittivity adjusting filler and the high permeability filler has an air region inside.

4. The thermally conductive composition according to claim 1, wherein the relative permeability has an imaginary part.

5. A thermally conductive composition comprising:
   a base material;
   a permittivity adjusting filler having a lower permittivity than the base material; and
   a high permeability filler having a higher permeability than the base material,
   wherein the entire thermally conductive composition has a relative permeability higher than 1 and a relative permittivity of 7 or lower.

6. The thermally conductive composition according to claim 5, wherein the permittivity adjusting filler is a material selected from the group consisting of boron nitride and silica.

7. The thermally conductive composition according to claim 5, wherein a thermal conductivity of entirety of the thermally conductive composition is higher than a thermal conductivity of the base material.

8. The thermally conductive composition according to claim 5, wherein at least one of the permittivity adjusting filler and the high permeability filler has an air region inside.

9. The thermally conductive composition according to claim 5, wherein the relative permeability has an imaginary part.

* * * * *